United States Patent [19]

Lusignan et al.

[11] Patent Number: 4,754,226

[45] Date of Patent: Jun. 28, 1988

[54] SWITCHED CAPACITOR FUNCTION GENERATOR

[75] Inventors: Bruce B. Lusignan, Palo Alto; JameBond Kuo, Stanford, both of Calif.

[73] Assignee: Stanford University, Stanford, Calif.

[21] Appl. No.: 874,893

[22] Filed: Jun. 16, 1986 (Under 37 CFR 1.47)

Related U.S. Application Data

[63] Continuation of Ser. No. 548,160, Nov. 2, 1983, abandoned.

[51] Int. Cl.[4] .......................... G06G 7/00; H03B 1/00; A03K 5/00

[52] U.S. Cl. .................................... 328/158; 328/167; 328/160; 328/127; 307/529; 307/520

[58] Field of Search ................ 307/529; 328/145, 129, 328/160, 144, 161; 364/718, 754, 761, 851, 841, 850

[56] References Cited

U.S. PATENT DOCUMENTS

| | | | |
|---|---|---|---|
| 4,315,227 | 2/1982 | Fleischer et al. | 333/173 |
| 4,331,894 | 5/1982 | Gregorian et al. | 330/107 |
| 4,354,169 | 10/1982 | Nossek | 330/107 |
| 4,404,525 | 9/1983 | Amir et al. | 328/107 |
| 4,453,143 | 6/1984 | Bennett | 333/173 |
| 4,468,749 | 8/1984 | Kato | 307/520 |

OTHER PUBLICATIONS

Young et al., "MOS Switched-Cap. Analog Sampled-Data Direct-Form Filters", IEEE Journals of Solid State Circuits, vol. SC-14, No. 6, Dec. 1979, pp. 1020-1033.

*Primary Examiner*—Stanley D. Miller
*Assistant Examiner*—Timothy P. Callahan
*Attorney, Agent, or Firm*—Flehr, Hohbach, Test, Albritton & Herbert

[57] ABSTRACT

An analog function generator useful in providing a variety of functions for analog signal processing applications includes a pulse width modulator and a switched capacitor operational amplifier. Capacitors in the input of the operational amplifier and in the feedback loop of the operational amplifier are selectively switched by the output of the modulator to create output voltages of the amplifier that are polynomial, logarithmic or exponential functions of the input voltages to the amplifier and pulse width modulator.

4 Claims, 6 Drawing Sheets

SWITCHED CAPACITOR FUNCTION GENERATOR

This is a continuation of application Ser. No. 548,160 filed Nov. 2, 1983.

This invention relates generally to an analog functional circuit for use in very large scale integrated circuits (VLSI) and more particularly the invention relates to switched capacitor circuits for pulse width modulation and generation of polynominal functions.

Switched capacitor techniques are known for creating large effective resistance (R) to use with small capacitances (C) in low frequency analog VLSI circuits. A major application is in audio frequency filters which require large RC values. Having a large effective resistance permits use of small equivalent capacitance and, hence, space saving in VLSI circuits.

As will be described further hereinbelow, the high effective resistance is obtained by providing a switched capacitor in the input of an operational amplifier and a switched capacitor in the feedback loop of the operational amplifier. This circuit is equivalent to a one-pole low pass filter having a large input resistance value. However, known prior art switched capacitor VLSI circuits cannot provide many of the functions that would be useful in low frequency applications.

The present invention is directed to a functional building block using switched capacitor circuits. The building block comprises a pulse width modulator and a switched capacitor operational amplifier with the capacitors being selectively switched by the output of the modulator. Signal multiplication, voltage expansion, gain control, voltage division, variable pole filters, and compressors are some of the functions achieved with the functional building block. Functions available with the circuitry include x.y, $x^2$, x/y, x, $xy^n$, $xy^{-n}$, log x, and $e^x$ where x and y are input wave forms creating the f(x,y) outputs. With these functions a wide range of analog applications can be realized.

Accordingly, an object of the invention is an analog function generator for providing a family of low frequency VLSI circuits.

A feature of the invention is a pulse width modulator for generating timing pulses for use in switched capacitor circuitry.

The invention and objects and features thereof will be more readily apparent from the following detailed description and appended claims when taken with the drawings, in which:

Figure 1A:
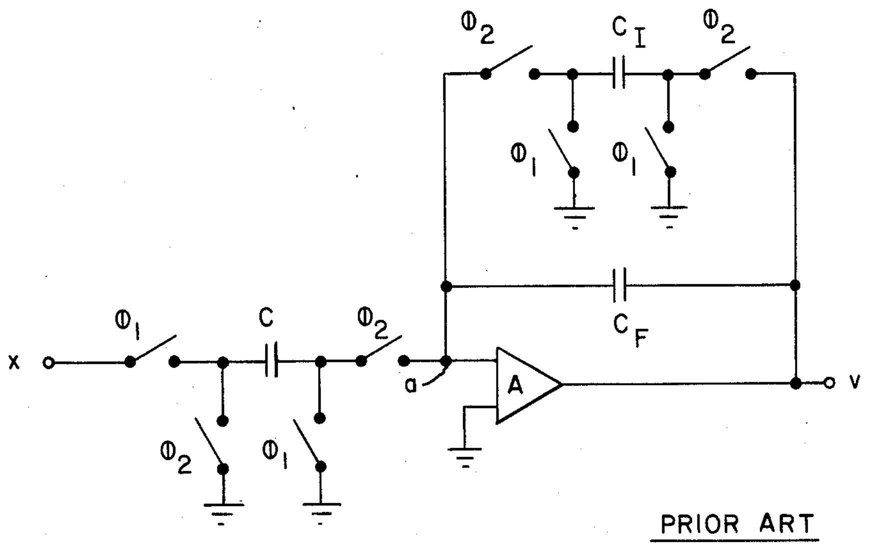
PRIOR ART FIG.—1a
FIGS. 1a–1c illustrate switched capacitor circuitry and operation in accordance with the prior art.
Figure 1B:
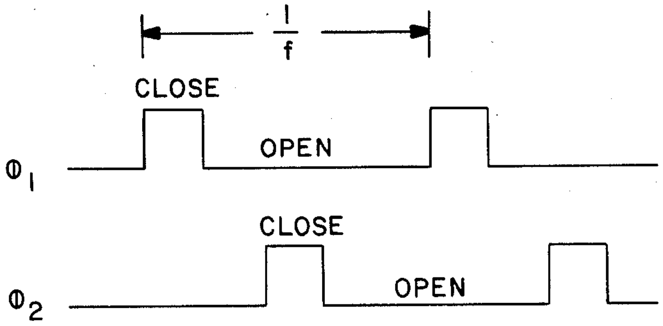
PRIOR ART FIG.—1b
Figure 1C:
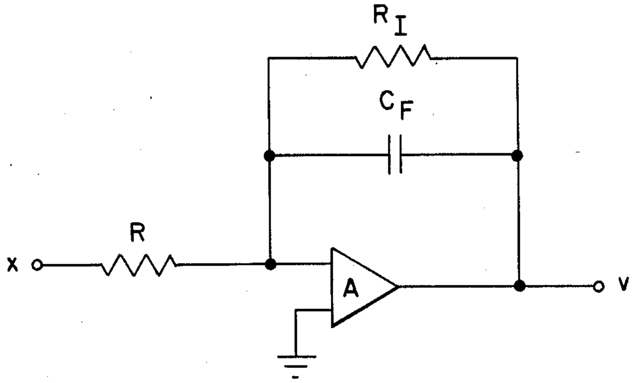
PRIOR ART FIG.—1c

Referring now to the drawings, FIGS. 1a–1c illustrate the structure and operation of a switched capacitor circuit in accordance with the prior art. FIG. 1a illustrates schematically an amplifier A having a switched capacitor $C_I$ and a fixec capacitor $C_F$ in its feedback loop and a switched capacitor C connected to the input of the amplifier. FIG. 1b illustrates the switching signals, $\phi_1$ and $\phi_2$, which control the switches in the circuitry of FIG. 1a, and FIG. 1c is the equivalent one-pole filter of the circuit of FIG. 1a.

In time period $\phi_1$, the switches labeled $\phi_1$ close. Capacitor C takes on charge q=XC (X is the input voltage waveform). During the same time period Capacitor $C_I$ is emptied. $C_F$ maintains its current charge, $qf=vC_F$ (v is the output voltage waveform). In time period $\phi_2$, the switches labeled $\phi_2$ close. Charge q discharges into amplifier junction "a". Also, a charge $q=vC_I$ flows into junction "a" as $C_I$ charges up to voltage v. The differential charge flows into capacitor $C_F$ $$qf=q-q_i, \tag{1}$$

This causes an incremental change in voltage out $$\Delta v=q/C_F=X(C/C_F)-v(C_I/C_F) \tag{2}$$

The change occurs in time interval Δt=1/f. (This time is short compared with changes in either x or v.) The change of voltage out with time thus equals:

$$\Delta v/\Delta t=X(C_f/C_F)-v(C_If/C_F) \tag{3}$$

With f large compared with variations in X and v, the equation can be written:

$$C_F9dv/dt)=)C_F)X-(C_If)v \tag{4}$$

This is the same as the equation for the conventional amplifier shown in FIG. 1(c) if the component values are given by:

$$R_I=1/C_If;\ R=1/Cf;\ C_F=C_F \tag{5}$$

This is a 1-pole low-pass filter with a gain and cutoff frequency given by:

$$G=R_I/R=C/C_I;\ f_{3\ dB}=1/R_1C_F=f(C_I/C_F) \tag{6}$$

For frequencies well below $f_{3\ dB}$, the output is given by $$v=X)C/C_I) \tag{7}$$

The cutoff frequency, $f_{3\ dB}$, can be made low by choosing the proper switching frequency, f, and ratio of capacitors $C_IC_F$. With this approach the C's can be made small enough for VLSI circuits.

It is assumed that any residual resistance in the switches show is small, so that $$_{res}=R_{res}*C<<\phi_1 \text{ or } \phi_2 \tag{8}$$

That is, the charge and discharge of $C_i$ and C is very fast compared with the switching periods.

The low-pass filter illustrated is only one simple embodiment of switch-capacitor filter technology. In the general switch capacitor applications, multiple "resistors", switched capacitor "resistors" and normal capacitors are used in different circuit configurations to creat filters with "poles" and "zeros" in different locations.

Figure 2A:
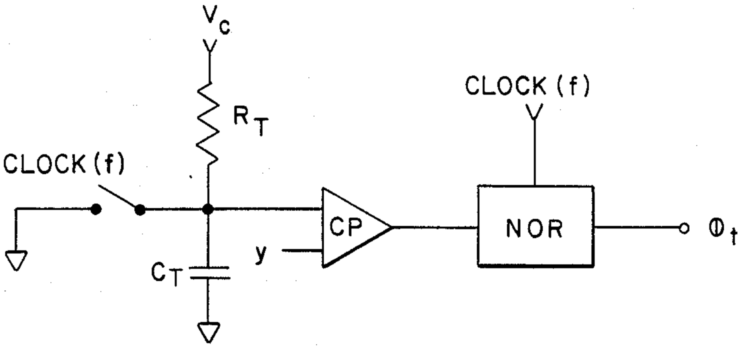
FIGS. 2a–2c illustrate a switched capacitor function generator in accordance with one embodiment of the present invention.
Figure 2B:
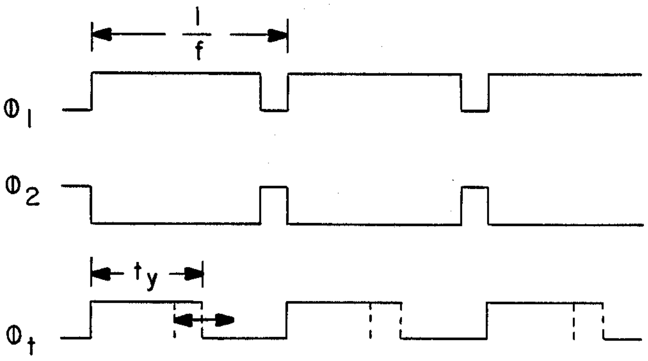
Figure 2C:
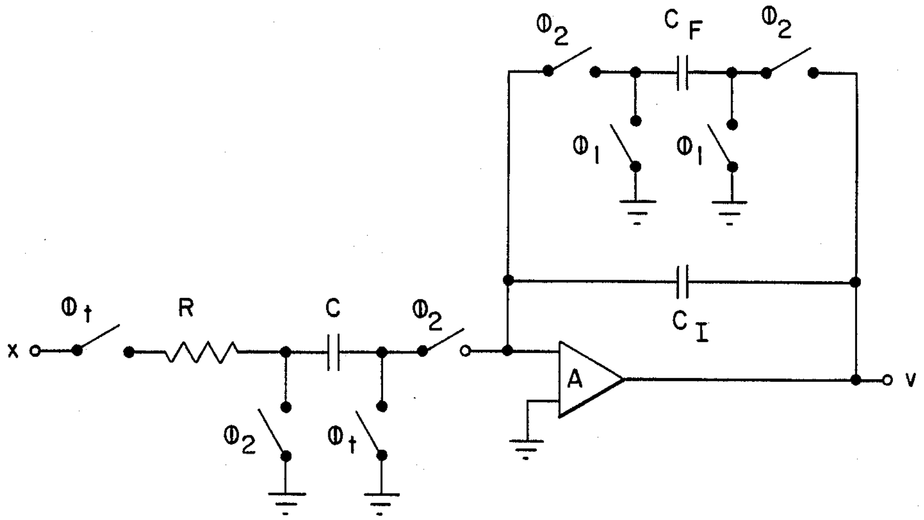

FIGS. 2*a*–2*c* illustrate a switched capacitor function generator in accordance with one embodiment of the present invention. FIG. 2*a* is a schematic of a pulse width modulator in which an output pulse, $\phi_t$, is generated in response to the closing of the input switch by the clock signal (f) and comparing the charge generated on capacitor $C_T$ with a voltage $v_y$. The generated pulse width is obtained from the NOR gate which is connected to receive the output of the comparator, CP, and the clock signal. FIG. 2*b* is a plot of the clock signals $\phi_1$, $\phi_2$, and $\phi_t$; and FIG. 2*c* is a schematic of a switched capacitor circuit which is operated by the clock signals of FIG. 2*b*.

Referring to FIG. 2*a*, a pulse starts from clock (f) with the voltage across $C_T$ equal to "0". At the start of the clock pulse, charge flows from $V_C$ through $R_T$, charging $C_T$ at an exponential rate. The comparator circuit, CP, senses when the voltage on $C_T$ has risen to equal the input voltage, $V_Y$. The pulse end is then triggered by the comparator. The capacitor $C_T$ is discharged and held at zero volts until the next clock pulse (f).

This circuit generates a pulse $\phi_t$ with repetition rate, f, starting at the same time as $\phi_1$ and having a length $t_y$ given by $$t_y = -R_T C_T \ln(1 - y/V_C) \quad (9)$$

In FIG. 2(*c*) the switching waveforms are used to charge a switched capacitor, C, in series with a resistor R for time period $t_y$.

The charge, q, that flow into C during this time is thus given by $$q = XC(1 - e^{-ty/RC}) \quad (10)$$

$$q = XC(1 - e^{+(RTCT)/RC(\ln(1-y/VC))}) \quad (11)$$

The remainder of the circuit is identical to the switch capacitor circuit described in FIG. 1*a*. Thus, the performance is the same if the value C′ is substituted for by C where $$C' = C(1 - e^{+(RTCT)/RC(\ln(1-y/VC)}) \quad (12)$$

This can be rewritten using the relation, $e^{a\ln(b)} = b^a$.

$$C' = C(1 - (1 - y/V_C)^{(RTCT/RC)}) \quad (13)$$

Many different functions can be developed with this relationship. The first family of function generators evolves from setting the two time constants RC and $R_T C_T$ equal to each other:

For $$RC = R_T C_T$$

$$C' = y^* C/V_C \quad (14)$$

This is a straight multiplier with gain and bandwidth $$G = C'/C_I = (y/V_C)^*(C/C_I) \quad (15)$$

$$F_{3\ dB} = f^* C_I/C_F \quad (16)$$

The output, v, and two inputs, y and x, are given by $$v = x^* y(C/C_I V_C)\text{: MULTIPLIER} \quad (17)$$

Figure 3:
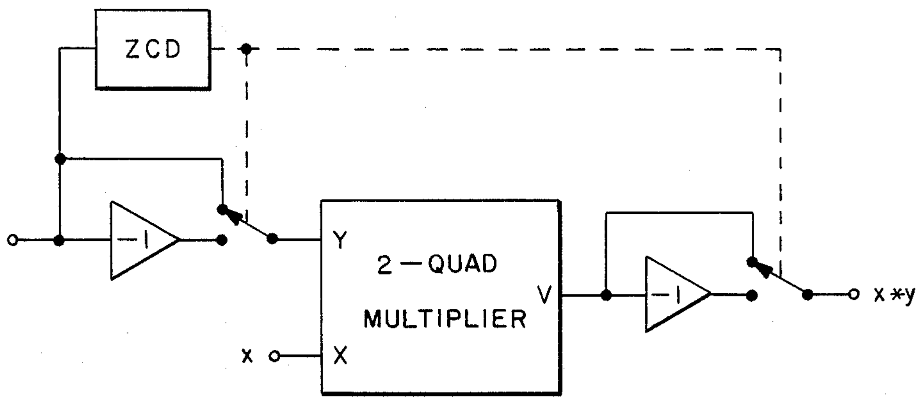
FIG. 3 is a functional block diagram of a four-quadrant multiplier in accordance with the invention.

The above is a 2-quadrant multiplier; that is, the value of "y" must be positive because the time interval, $t_y$, cannot take on negative values. If negative values of "y" are anticipated, a simple way to create a 4-quadrant multiplier is to use a zero-crossing detector (ZCD) and two inverting amplifiers, as shown in FIG. 3.

A square-law voltage expandor is formed by connecting the same signal to both inputs of the multiplier (2 or 4 quadrants depending on the range of input voltage).

Figure 4A:
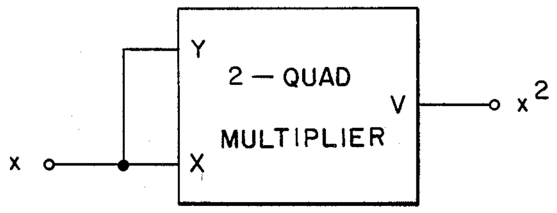
FIG. 4a and FIG. 4b are functional block diagrams of a two-quadrant and a four-quadrant, respectively, square law expandor in accordance with the invention.
Figure 4B:
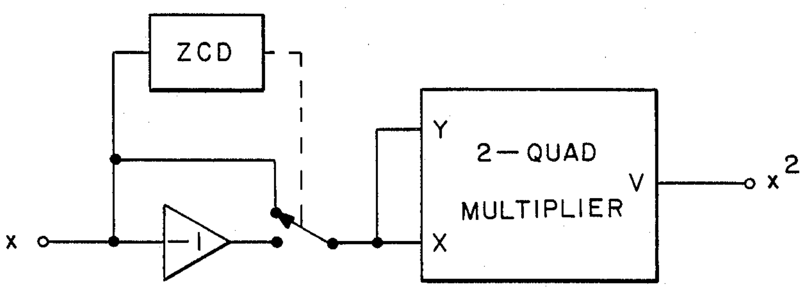

FIGS. 4*a* and 4*b* show that in this case one inverter is saved by rectifying x before input to a 2-quadrant multiplier.

Figure 5A:
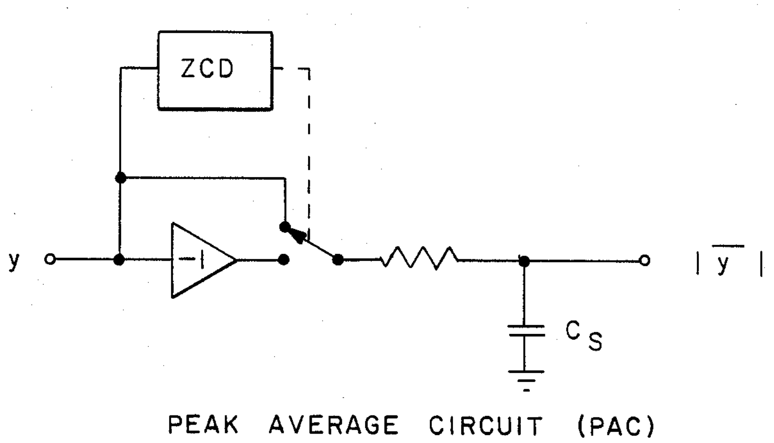
FIG. 5a and FIG. 5b are functional block diagrams of a peak average circuit and a syllabic square law expandor, respectively, in accordance with the invention.
Figure 5B:
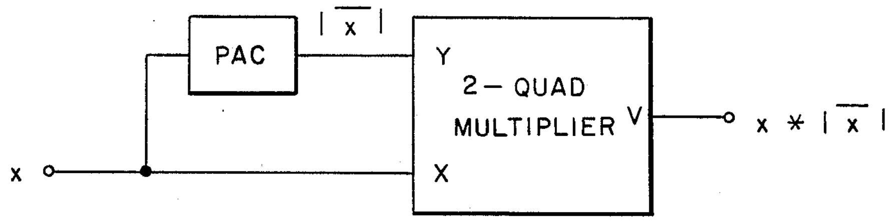

A circuit to obtain the time average peaks of a waveform is shown in FIG. 5*a*. This is used in a voice processing to vary gain at the rate of power changes in voiced syllables. A square-law syllabic expandor using this circuit is shown in FIG. 5*b*.

The basic 2-quadrant multiplier can be used in a wide range of gain control applications where the input y in FIG. 2 is from a feedback sensing element. Normally, the sign of y in such applications is positive to the 2-quadrant multiplier can be used. Applications include tape recorders and playback, AM radios, "Dolby" circuits, and mobile radio.

Figure 6A:
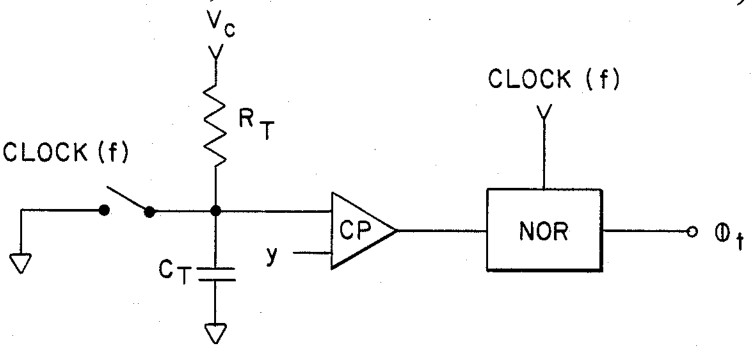
FIGS. 6a–6c illustrate a switched capacitor function generator in accordance with another embodiment of the invention.
Figure 6B:
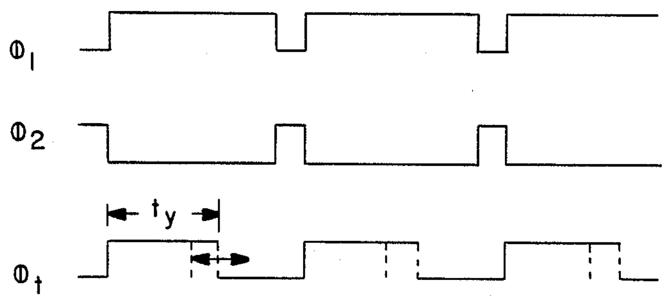
Figure 6C:
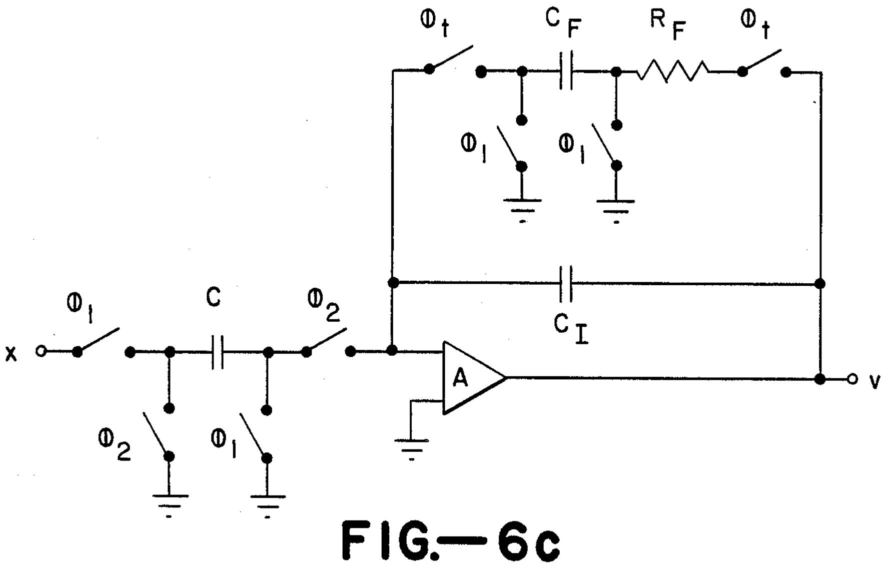

Another basic function (divider) circuit in accordance with the invention is illustrated in FIGS. 6*a*–6*c*. The time circuit is the same as shown in FIG. 2*a*. Now, however, the charging capacitor in FIG. 6*c* which is being controlled is $C_I$ rather than C. The charge, $q_I$, is then given by $$\begin{aligned} q_1 &= vC_I(1 - e^{-ty/(RICI)}) \\ &= vC_I(1 - e^{+(RTCT)/RICI) * \ln(1-y/VC))}) \\ &= vC_I(1 - (1 - y/V_C)^{(RTCT/RICI)}) \end{aligned} \quad (18)$$

The relationships are the same as the circuit of FIG. 1 if $C_I'$ is substituted for $C_I$ where $$C' = C_I(1 - (1 - y/V_C)^{(RTCT)/RICI)}) \quad (19)$$

The simple application is when $R_T C_T$ and $R_I C_I$ are matched. Then the value of $C_I$ is $$C_I = C_I y/V_C \quad (20)$$

With these values the circuit of FIG. 6 has gain bandwidth and transfer functions given by $$G = C/C_I V_C/y;\ f_{3\ dB} = f^* C_I/C_F(y/V_C) \quad (21)$$

$$v = x/y(V_C C/C_I)\text{: DIVIDER} \quad (22)$$

The divider has the limitation that the cutoff frequency, $f_{3\ dB}$, varies with the input voltage. It also has the mathematical limitation of all dividers that division by zero implies infinite output voltage, v. The circuit saturates for small y and, therefore, would not be used for y that would change sign. It is useful as a 2-quadrant divider as long as the output desired can be limited.

Figure 7:
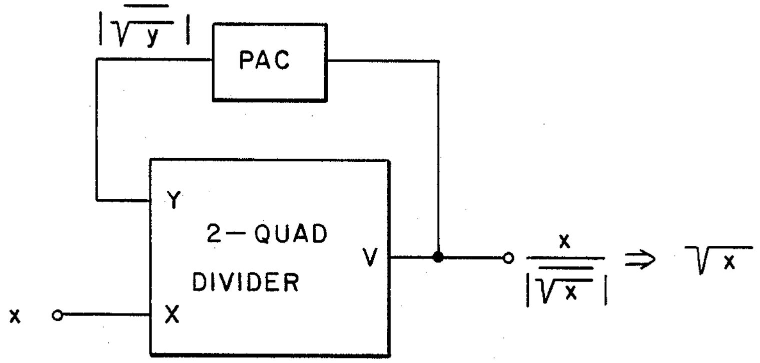
FIG. 7 is a functional block diagram of a square law syllabic amplitude compressor in accordance with the invention.

FIG. 7 illustrates the 2-quadrant divider used as a syllabic voice compressor. It will be noted that the actual relationship between Y, X and V is a feedback function whose stability depends on the peak-amplitude comparator (PAC) time constant.

The performance of the circuit of FiG. 7 is better understood as action on a sine wave. If X is a waveform, (A sin wt), the output is ($\sqrt{A}$ sin wt). The input value for Y is $\sqrt{A}$ (the PAC circuit gives an output equal to the peak input voltage). The input waveform is, thus divided by a constant $\sqrt{A}$ and becomes $$v=(A \sin wt)/\sqrt{A}=\sqrt{A} \sin wt \tag{23}$$

This circuit is the standard syllabic compressor used today except for use of the switch-capacitor invention to realize the required power law. In this circuit the value of $C_F$ is choosen so that the bandpass variation with the output voltage is not bothersome.

Figure 8A:
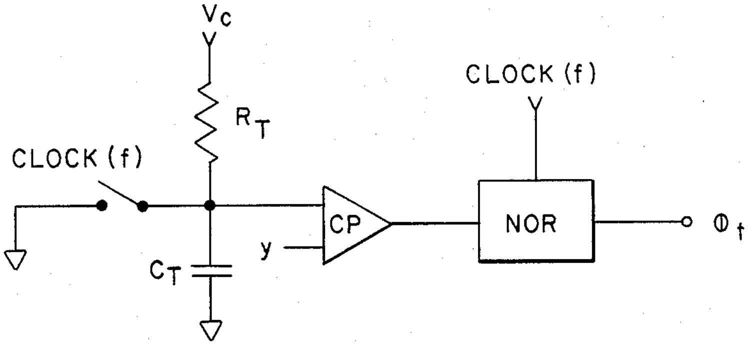
FIGS. 8a–8c illustrate a switched capacitor function generator in accordance with another embodiment of the invention.
Figure 8B:
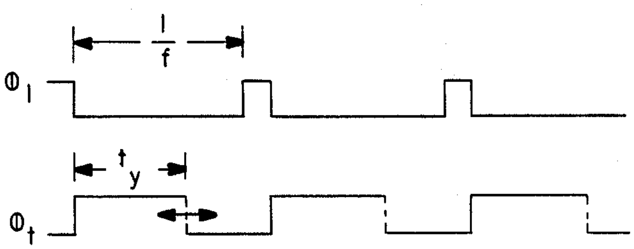
Figure 8C:
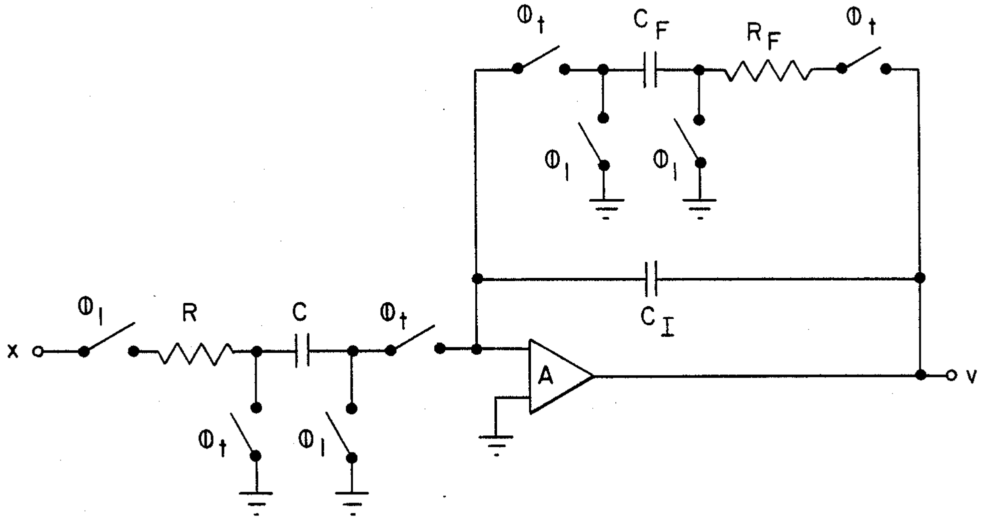

Another basic function generator in accordance with the invention is shown in FIGS. 8*a*–8*c*. Here both switched capacitors in FIG. 8*c* are controlled.

The effective capacitor values are still given by the equation (12) and (13), above. With these values the gain is given by $$G=\left(\frac{C}{C_1}\right)\left(\frac{1-(1-y/V_C)^{(RTCT/RC)}}{1-(1-y/V_C)^{(RTCT/RICI)}}\right) \tag{24}$$

If the three time constants are equated, the two terms including y cancel the gain becomes constant.

$$G=C/C_I;\ \text{if } R_TC_T=RC=R_IC_I$$

The cutoff frequency depends on $C_I$, but not C′.

$$f_{3\,dB}=f^*C_I/C_F^*(1-(1-y/V_C)^{(RICI/RICI)})$$

If the time constants are equated, the result is simple:

$$f_{3\,dB}=f^*C_I/C_F^*(y/V_C);\ \text{if } R_TC_T=R_IC_I$$

The variable filter element has a constant gain and a law-pass 3 db cutoff frequency that is a linear function of control voltage, y.

The gain control and the variable pole filter described above are just two examples of filters whose characteristics are linearly controlled by voltage. In any switched capacitor filter, an $R_n$ can be added to any or all $C_n$ such that $R_nC_n=R_TC_T$. The poles can be varied by a control voltage, y. This capability can be of use in adaptive filtering applications.

In the applications described above, the relationships are simplified by equating time constants. Other ratios of time constants create polynomial relationships that have other applications. The functions are as given below for the multiplier module of FIG. 2.

$$v=C/C_I^*(1-(1-y')^n)X \tag{25}$$

where $$y'=y/V_C$$

$$n=R_TC_T/RC$$

The circuit of FIG. 2*c*, a time circuit $R_TC_T$, charges exponentially. This circuit is easily modified to generate a current $V_C/R_T$ that does not vary with charging of $C_T$. Then the time is given by $$ty=y^*R_TC_T/V_C \tag{26}$$

The charge is given by $$q=XC(1-e^{-ty/RC})=XC(1-e^{(RTCT)/(RC)^*Y})$$

$$C'=C(1-e^{-(RTCT)/(RC)^*Y} \tag{27}$$

The gain is given by $$G=C/C_I^*(1-e^{-y});\ \text{if } R_TC_T/RC=1$$

$$v=aX(1-e^{-y});\ a=C/C_1 \tag{28}$$

In a similar way the input X in FIG. 2 can be made a current generator with current i−X/R. In this case the function becomes $$v=-aX \ln(1-Y/V_C);\ \text{where } A=C_TR_T/C_IR \tag{29}$$

There have been described several embodiments of an analog function generator for providing a family of low frequency VLSI circuits which have heretofore been unavailable using switched capacitor building blocks. As is evident from the description, many functions can be implemented through simple variations in the placement and control of the capacitors. Thus, while the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. Function generator circuitry for generating functions of two variable signals (x, y) comprising a pulse width modulator for generating an output pulse whose width is a function of one variable signal, a feedback amplifier circuit including a differential amplifier having a first input terminal and an output terminal, a feedback loop interconnected between said output terminal and said first input terminal and including a first capacitor ($C_F$) and first switch means for selectively connecting said first capacitor in said feedback loop, and a second capacitor (C) and second switch means for selectively interconnecting said second capacitor between a second variable signal (x) and said first input terminal, said pulse width modulator comprising a first resistor ($R_T$) and a third capacitor ($C_T$) serially connected between two voltage potentials ($V_C$, GND) and having a common terminal, third switch means for periodically shorting across said capacitor in response to a clock signal (f), comparator means connected to the common terminal of said first resistor and said third capacitor and to said one variable signal and generating a clocked (f) pulse (ϕ) whose width is a function of comparing voltage at said common terminal and said one variable signal (y), said feedback loop including a fourth capacitor ($C_I$) interconnected between said output terminal and said first input terminal of said differential amplifier; and means for controlling in part at least one of said first switch means and said second switch means including means connecting said output pulse from said pulse width modulator to said first switch means and to said second switch means for controlling said first switch means and said second switch means, wherein at least one of said first switch means and said second switch means is controlled in part by said clock signal (f), said circuitry performing a multiplication functions as follows:

$$v=x*y(C/C_I V_C).$$

2. Function generator circuitry for generating functions of two variable signals (x, y) comprising a pulse width modulator for generating an output pulse whose width is a function of one variable signal, a feedback amplifier circuit including a differential amplifier having a first input terminal and an output terminal, a feedback loop interconnected between said output terminal and said first input terminal and including a first capacitor ($C_F$) and a serially connected first resistor ($R_F$) and first switch means for selectively connecting said first capacitor and first resistor in said feedback loop, and a second capacitor (C) and second switch means for selectively interconnecting said second capacitor between a second variable signal (x) and said first input terminal, said pulse width modulator comprising a second resistor ($R_T$) and a third capacitor ($C_T$) serially connected between two voltage potentials ($V_C$, GND) and having a common terminal, third switch means for periodically shorting across said capacitor in repsonse to a clock signal (f), comparator means connected to the common terminal of said first resistor and said third capacitor and to said one variable signal and generating a clocked (f) pulse ($\phi$) whose width is a function of comparing voltage at said common terminal and said one variable signal (y), said feedback loop including a fourth capacitor ($C_I$) interconnected between said output terminal and said first input terminal of said differential amplifier; and means for controlling in part at least one of said first switch means and said second switch means including means connecting said output pulse from said pulse width modulator to said first switch means and to said second switch means for controlling said first switch means and said second switch means, wherein at least one of said first switch means and said second switch means is controlled in part by said clock signal (f).

3. Circuitry as defined by claim 2 wherein a variable pole filter is provided with a gain (G) as follows:

$$G=\left(\frac{C}{C_I}\right)\frac{1-(1-y/V_C)^{(RTCT/RC)}}{1-(1-y(V_C)^{(RTCT/RFCF)}}$$

and a 3 dB cut-off frequency as follows:

$$f_{3\,dB}=f^*c_I/C_F(y/V_C).$$

4. Circuitry as defined by claim 2 wherein a division function is performed as follows:

$$V=x/y(V_C C/C_I).$$

* * * * *